United States Patent
Test

[19]

[11] Patent Number: 5,979,743
[45] Date of Patent: Nov. 9, 1999

[54] METHOD FOR MAKING AN IC DEVICE USING A SINGLE-HEADED BONDER

[75] Inventor: Howard R. Test, Plano, Tex.

[73] Assignee: Texas Instruments Incorporated, Dallas, Tex.

[21] Appl. No.: 08/865,630

[22] Filed: May 29, 1997

Related U.S. Application Data

[63] Continuation-in-part of application No. 08/683,756, Jul. 17, 1996, abandoned, which is a continuation of application No. 08/255,582, Jun. 8, 1994, Pat. No. 5,544,804.

[51] Int. Cl.⁶ .................................................. H01L 21/60
[52] U.S. Cl. ..................... 228/180.5; 228/4.5; 228/49.5
[58] Field of Search ................................ 228/180.5, 4.5, 228/44.7, 49.5

[56] References Cited

U.S. PATENT DOCUMENTS

| | | | |
|---|---|---|---|
| 5,465,899 | 11/1995 | Quick et al. | 228/180.5 |
| 5,544,804 | 8/1996 | Test et al. | 228/180.5 |

FOREIGN PATENT DOCUMENTS

| | | | |
|---|---|---|---|
| 54-128271 | 10/1979 | Japan | 228/4.5 |
| 4-28241 | 1/1992 | Japan | 228/180.5 |

*Primary Examiner*—Patrick Ryan
*Assistant Examiner*—Jeffrey T. Knapp
*Attorney, Agent, or Firm*—Navarro IP Law Group; Gary C. Honeycutt

[57] ABSTRACT

A method of using a single-headed bonder (80) to form bonds to bond pads (16) is provided. A single-headed bonder (80) includes a capillary (22) having a capillary face (40) with a long dimension along a first axis (BB) and a short dimension along a second axis (CC). The long dimension of the capillary face (40) is aligned in a first orientation such that the bond pads (16) are bonded in a first direction associated with the first orientation. The capillary (22) is then rotated to place the long dimension in a second orientation such that all the bond pads (16) are bonded in a second direction associated with the second orientation. In place of rotating the capillary (22), a second single-headed bonder (90) having a capillary (22) rotated to the second orientation can be used to bond bond pads (16) in the second direction. Transportation between bonders can be done manually, by a transport mechanism (60), by a robotic arm (70), or other suitable means.

18 Claims, 3 Drawing Sheets

METHOD FOR MAKING AN IC DEVICE USING A SINGLE-HEADED BONDER

CROSS-REFERENCE TO RELATED APPLICATIONS

This application is a continuation-in-part of U.S. patent application Ser. No. 08/683,756, filed Jul. 17, 1996, now abandoned; which is a continuation of U.S. patent application Ser. No. 08/255,582, filed Jun. 8, 1994, now U.S. Pat. No. 5,544,804.

TECHNICAL FIELD OF THE INVENTION

The present invention generally relates to the manufacture of integrated circuit devices and, more particularly, to a method of manufacturing integrated circuit devices using a single-headed bonder to form bonds.

BACKGROUND OF THE INVENTION

Integrated circuit devices are typically formed by mounting an integrated circuit chip on a lead frame and coupling these two elements to form an assembly. The integrated circuit chip and lead frame may be encapsulated. Typically, the chip includes a number of bond pads that may be positioned about the chip according to a predetermined spacing. The lead frame typically includes a number of leads about a perimeter thereof. One type of lead frame, for example, has a generally rectangular shape with each side of the rectangle having a number of leads. Typically, the leads have a relatively narrow elongated shape with a longitudinal axis that is generally perpendicular to the side of the lead frame on which the lead is located. A lead frame may be said to have an X and Y axis. Therefore, leads on one pair of opposing sides of the lead frame have longitudinal axes extending generally in the X-axis direction. Leads on the other pair of opposing sides of the lead frame have longitudinal axes extending generally in the Y-axis direction. Some leads may have longitudinal axes that are offset from the X-axis and Y-axis directions.

To couple the integrated circuit chip to the leads of the lead frame electrically, a wire bonding technique is often used. A wire bonding machine may have a spool of a bonding wire mounted on the machine. The bonding wire may be threaded through a capillary mounted to an ultrasonic horn of the wire bonding machine. The horn may be manipulated to move the capillary both vertically and horizontally. Typically, the wire bonding machine includes a device for heating or applying a spark to an end of the bonding wire that protrudes from an exit end of the capillary. The molten wire may form the shape of a ball that is placed on a target bond pad by manipulating the horn to move the capillary.

After this bond pad bond is created, a sufficient amount of bonding wire is released to allow the capillary to be moved to a location near an inner end of a target lead of the lead frame. The capillary is manipulated to connect the bonding wire to the inner end of the target lead and partially cut the bonding wire so bonding wire can be drawn from the exit end of the capillary as the capillary is raised by the horn until a sufficient length of bond wire protrudes from the exit end of the capillary in preparation to break the bond wire at the partially cut portion of the bond wire. The end of the bond wire is now free to form a new bond between a new target bond pad and target lead. Any type of suitable bond may be made at either the bond pad or the lead, including ball bonds, stitch bonds, and wedge bonds. A ball bond may be used, for example, at the bond pad. A stitch bond may be used, for example, at the lead. To complement the bonding process, the assembly components may be heated. Also, ultrasonic energy may be applied.

Problems in wire bonding techniques arise in part from the desire to increase the number of bond pads and leads in a given assembly and to make lead frame/chip assemblies smaller and smaller. This may require that the bonding pads located on the chip be made smaller and be spaced closer together. The same can be said for the leads on a lead frame.

The exit end of a wire bonding capillary is often called the capillary face. Previous capillaries have had a circular face. A disadvantage of having a capillary with a circular face is that the spacing between bonds is limited. After a bond is made at a particular bond pad, for example, if the adjacent bond pad is too close, then the capillary face may strike the ball bond that has been made at a first bond pad during the process of making a bond on an adjacent bond pad.

One method for solving this shortcoming is to use a wire bonding capillary with a non-circular face. This type of approach is shown, for example, in U.S. Pat. No. 5,544,804 issued to Test, et al., which is hereby incorporated by reference for all purposes. Test, et al. shows a capillary having a non-circular face. The face of the capillary may have a shape that includes a pair of opposed convex sides joining a pair of opposed concave sides. The capillary may be generally described as having a longitudinal axis extending across the midpoints of the convex sides and through its center. The capillary allows ball bonds, for example, to be made closer to one another than with a circular capillary face. The capillary can also make strong stitch bonds. Typically, the stitch bond is made by the capillary having its longitudinal axis generally oriented along the longitudinal axis of the target lead. Some wire bonding machines, known generally as dual-headed bonding machines, utilize two such capillaries. One capillary is used to make the ball and stitch bonds in the X-axis direction of a given assembly and the other capillary is used to make the ball and stitch bonds in the Y-axis direction of the assembly.

A problem arising in this situation is that not all bonding machines are dual-headed bonding machines. Instead, there are single-headed bonding machines that have one capillary aligned in one direction. While this type of set up can make bonds in one direction, due to the noncircular face of the capillary, they cannot make adequate bonds in the other direction without some sort of modification to the bonder or the capillary. Thus, a need exists for a method of making integrated circuit devices using a capillary with a non-circular face in single-headed bonding machines.

SUMMARY OF THE INVENTION

In accordance with the present invention, a method of making an integrated circuit device using a capillary with a non-circular face in a single-headed bonding machine is provided.

In an embodiment of the present invention, described in greater detail below, a capillary is provided having a capillary face with a long dimension and a short dimension, with the short dimension in a direction normal to the long dimension. The capillary is oriented with the long dimension in a first orientation and used to bond conductive wire between one of a plurality of bond pads peripherally located along one edge of an integrated circuit chip and an inner lead of a respective one of a corresponding plurality of leads generally aligned along a first direction of a lead frame. This step is repeated for all of the plurality of bond pads along the edge and leads aligned in the first direction. Next, a rotated capillary oriented with the long dimension in a second orientation is provided. Then, wire is bonded between one of a plurality of bond pads located along a second edge of the chip and an inner lead of a respective one of a corresponding plurality of leads generally aligned along a second direction of the lead frame. This step is repeated for all of the plurality of bond pads along the second edge and leads aligned in the second direction.

The present invention provides closely spaced ball bonds on bond pads using single-headed bond machines and forms strong stitch bonds with a single-headed bonder.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
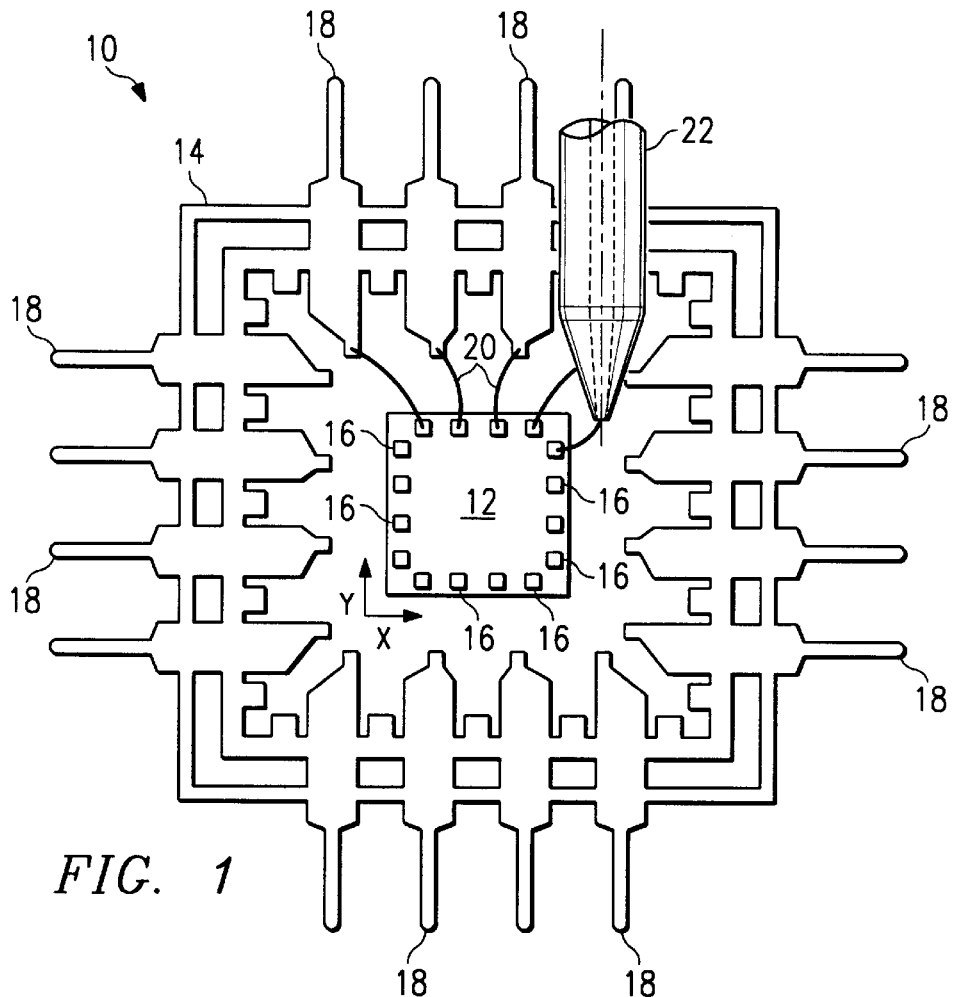
FIG. 1 is a diagram of a lead frame/chip assembly of an integrated circuit device, showing the use of a capillary.

FIG. 1 is a diagram of a lead frame/chip assembly 10 of an integrated circuit device showing the use of a capillary 22 in accordance with an exemplary method of the present invention. Lead frame/chip assembly 10 includes silicon chip 12 supported by lead frame 14. Bond pads 16 on silicon chip 12 are electrically coupled to leads 18 of lead frame 14 by gold wire 20. Gold wire 20 is applied and bonded to bond pads 16 and leads 18 by capillary 22.

Silicon chip 12 is sawed from a wafer of silicon material. Silicon chip 12 may also be a layer of amorphous silicon or other suitable material that may be used as a substrate for an integrated circuit. Circuitry (not explicitly shown) is incorporated into silicon chip 12 by processes such as vapor phase epitaxy, liquid phase epitaxy, photolithography, laser lithography, ion implantation, doping, and other suitable processes. The circuitry of silicon chip 12 is electrically coupled to bond pads 16.

Bond pads 16 are metallic pads formed around the periphery of silicon chip 12 by a suitable method, such as by evaporation of aluminum onto silicon chip 12. Bond pads 16 are typically spaced peripherally around the edges of silicon chip 12. In applications utilizing the present invention, the spacing between bond pads 16 may be as small as 0.003 inches or less.

Gold wire 20 is used to electrically couple bond pads 16 to leads 18. Gold wire 20 may alternately comprise many other suitable materials, such as silver wire, copper wire, or alloys containing gold, silver, or copper.

Figure 2:
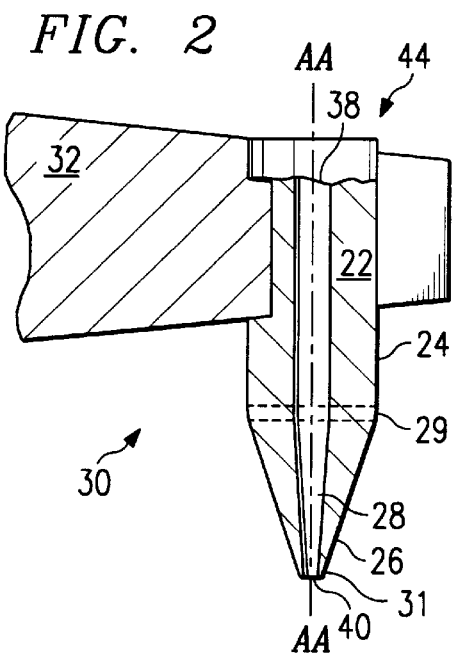
FIG. 2 is a cross-sectional view of the capillary.

FIG. 2 shows a cross-sectional view of capillary 22. Capillary 22 is used to connect gold wire 20 to bond pads 16 and leads 18. Capillary 22 has a tubular body comprising a shaft portion 24 which is integral with a capillary tip 26. Capillary 22 has a longitudinal axis in the general direction shown by line "AA" extending through an interior bore 28 of capillary 22. Gold wire 20 may be inserted through interior bore 28 of capillary 22 so as to exit from capillary tip 26.

Shaft portion 24 is cylindrical in shape and has a circular cross section. However, other shapes may be used so long as the bonding wire may be threaded through interior bore 28 of capillary 22. For example, capillary 22 may have a rectangular or elliptical cross section.

Capillary tip 26 is tapered from a first point 29, where capillary tip 26 meets shaft portion 24, to a second point 31 located at a capillary face 40 of capillary 22. Preferably, capillary tip 26 at second point 31 has a predetermined shape to facilitate the bonding process. Capillary 22 may be formed from many suitable materials, however, it is preferable that capillary 22 is formed from a high-strength material.

Capillary 22 is preferably secured in an ultrasonic horn 32 of a wire bonding machine. Gold wire 20 may be fed into interior bore entrance 38, through interior bore 28, and out of capillary face 40, so as to be applied to bond pads 16 and leads 18. The axial orientation of capillary 22 is fixed by a locking device and a bracing component on ultrasonic horn 32.

In operation, capillary 22 is used to apply gold wire 20 to bond pads 16 and leads 18. Capillary 22 is placed on a first bond pad 16 or an inner end of a first lead 18. A bond is then formed between first bond pad 16 or first lead 18 and gold wire 20, either by an interdiffusion process creating a weld by pressure from the capillary tip 26, temperature, ultrasonic energy, or by any other suitable method.

After a bond has been formed at the first bond pad 16 or the first lead 18, capillary 22 is then moved to a corresponding first lead 18 or first bond pad 16, respectively. For example, if the first bond was formed at a first bond pad 16, the second bond will be formed at a first lead 18 corresponding to first bond pad 16. In this manner, bond pads 16 and leads 18 may be electrically coupled. Similar connections are formed between all other bond pads 16 and leads 18 of lead frame/chip assembly 10.

Figure 3:
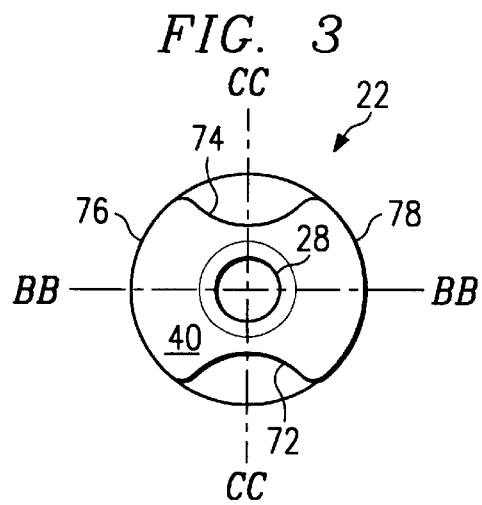
FIG. 3 is a drawing of the capillary face.

FIG. 3 is a drawing of capillary face 40. Capillary face 40 reveals the characteristic shape of capillary tip 26, having opposing concave surfaces 72 and 74 and opposing convex lobes 76 and 78 to form the general shape of a pinched oval. Capillary face 40 has a long dimension along axis "BB" and a short dimension along axis "CC". A capillary 22 having a capillary face 40 as shown in FIG. 3 may be used to apply gold wire 20 to bond pads 16 and leads 18 of silicon chip 12. For more information on capillary 22, reference is made to commonly assigned U.S. Pat. No. 5,544,804 which is hereby incorporated by reference herein.

Figure 4A:
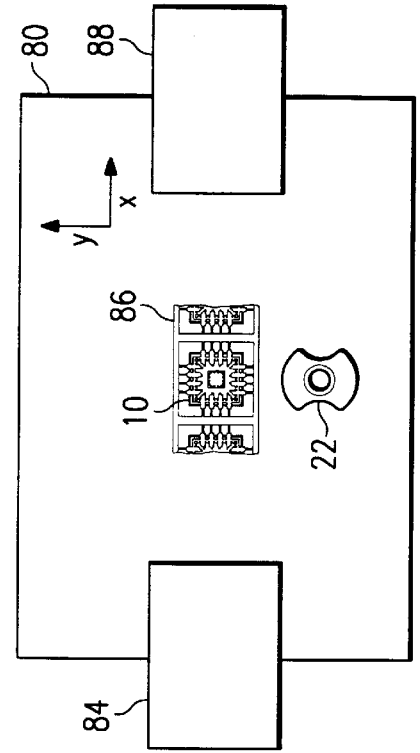
FIGS. 4A and 4B illustrate a bonding technique using one single-headed bonder.
Figure 4B:
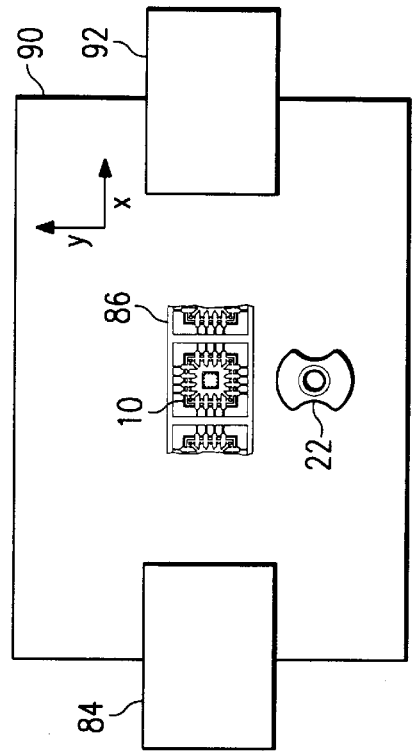

FIGS. 4A and 4B illustrate a bonding technique using a single-headed bonding machine 80. In FIG. 4A, single-headed bonding machine 80 has a single capillary 22 with a preset orientation oriented, e.g., in the X-axis direction. An input carrier 82 contains a plurality of lead frame strips 86. Each lead frame strip 86 contains one or more lead frame/chip assemblies 10. In operation, lead frame strip 86 will exit input carrier 82. All bond pads 16, for example, spaced along both Y-axis direction edges of chip 12 in lead frame strip 86 will be bonded to adjacent leads 18 aligned in, for example, the X-axis direction corresponding to the preset orientation. Lead frame strip 86 will then move to an output carrier 84.

Output carrier 84 is designed to hold one or more lead frame strips 86. Once all lead frame strips 86 have been bonded, capillary 22 is rotated to a second orientation, preferably normal to the preset orientation, for example, the Y-axis direction, as seen in FIG. 4B. In FIG. 4B, output carrier 84, now filled with lead frame strips 86 that have been bonded in one direction, has been moved to be the input carrier of single-headed bonding machine 80. Lead frame strips 86 will move from the carrier and bond pads 16 spaced, for example, along both X-axis direction edges of chip 12 will be bonded to adjacent leads 18 oriented, for example, in a second Y-axis direction perpendicular to the first X-axis direction. The finished lead frame strips 86 will then be collected in a second output carrier 88.

Figure 5:
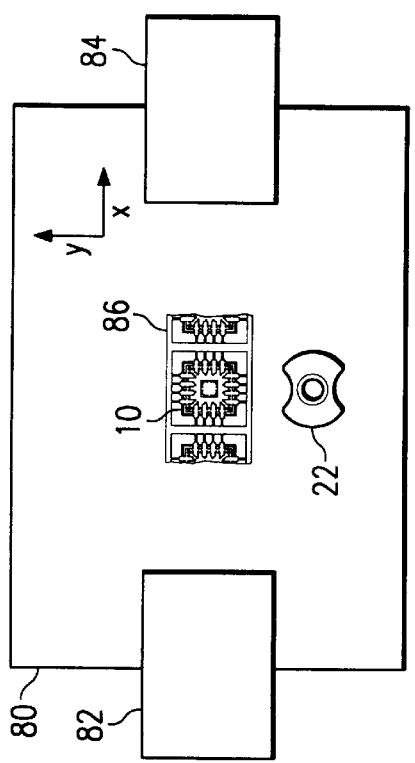
FIG. 5 illustrates a bonding technique using two single-headed bonding machines.
Figure 5:
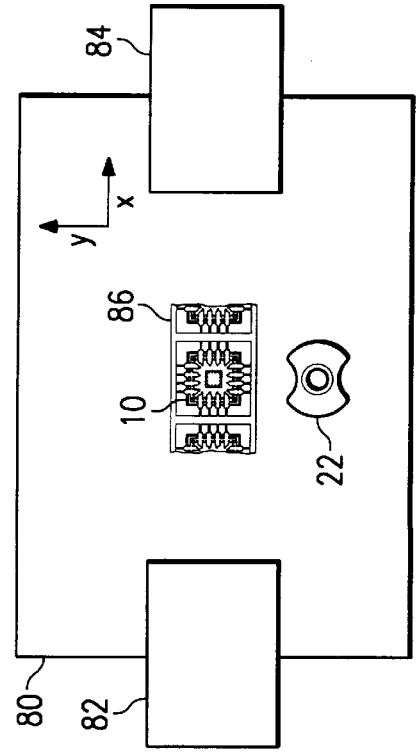

FIG. 5 illustrates a bonding technique using two single-headed bonding machines 80 and 90. First, single-headed bonding machine 80 has a single capillary 22 in a first, for example, X-axis direction orientation. Second single-headed bonding machine 90 has a single capillary 22 in a second, for example, Y-axis direction orientation which is preferably normal to the first orientation. In operation, lead frame strip 86, containing one or more lead frame/chip assemblies 10 will feed out of input carrier 82. Capillary 22 will bond all bond pads 16 spaced, for example, along both Y-axis direction edges of chip 12 to adjacent leads 18 oriented, for example, in the X-axis direction. As the lead frame strips 86 are completed they fill output carrier 84. When all the lead frame strips 86 are completed, the output carrier 84 is manually removed from first single-headed bonding machine 80 and placed as the input carrier for second single-headed bonding machine 90. Lead frame strips 86 will feed from output carrier 84 (now the input for single-headed bonding machine 90). Bond pads 16 spaced, for example, along both X-axis direction edges of chip 12 are bonded in a second direction to adjacent leads 18 oriented in the, for example, Y-axis direction, and the output carrier for the second single-headed bonding machine 92 will fill up. Alternatively, instead of moving an entire carrier of lead frame strips 86, individual lead frame strips 86 can be moved from one bonder to another. Also, alternatively, lead frames can be fed in a continuous lead frame strip, reel-to-reel across both bonder platforms.

Figure 6:
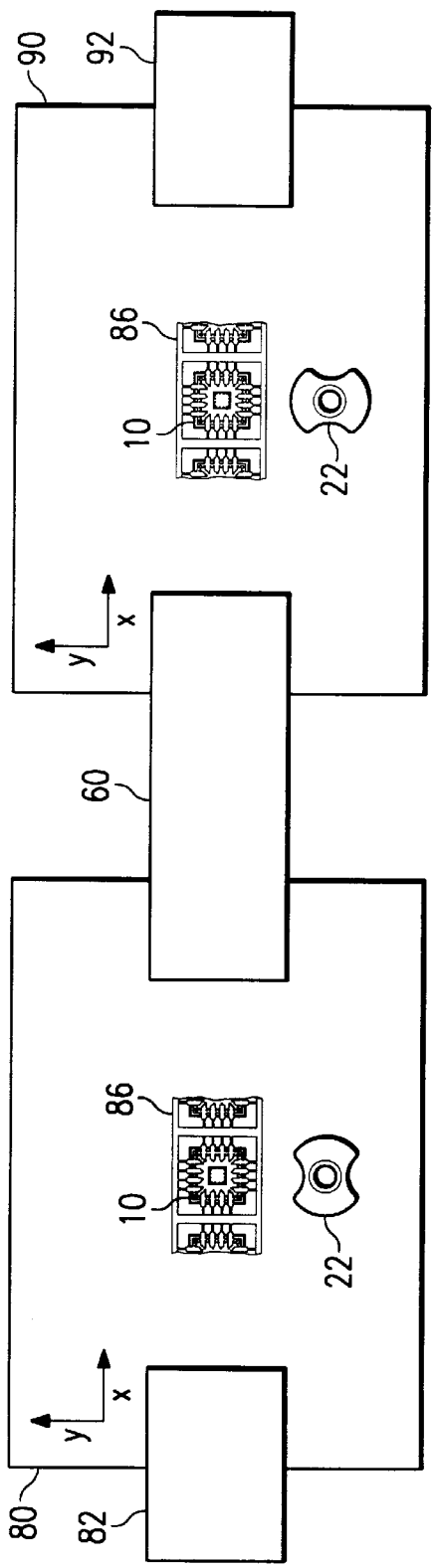
FIG. 6 illustrates a bonding technique using two single-headed bonding machines and a transport mechanism.

FIG. 6 illustrates a bonding technique using two single-headed bonding machines 80 and 90 and a transport mechanism 60. First single-headed bonding machine 80 has a single capillary 22 in a first orientation. Second single-headed bonding machine 90 has a single capillary 22 in a second orientation which is preferably normal to the first orientation. In operation, lead frame strips 86, containing one or more lead frame/chip assembly 10 will feed out of input carrier 82. Capillary 22 will bond bond pads 16 to adjacent leads 18 in one direction. As the lead frame strips 86 are completed they move to the second single-headed bonding machine 90 via transport mechanism 60 which connects the single-headed bonding machines 80 and 90. In the second machine, capillary 22 is aligned in a second direction and bond pads 16 will be bonded to adjacent leads 18 in that direction. As the lead frame strips 86 are completed they will fill output carrier 92. Alternatively, instead of moving individual lead frame strips 86, an output carrier in the first single-headed bonding machine 80 can fill and that output carrier can move via transport mechanism 60 to the input of the second single-headed bonding 90. The lead frame strips 86 can then be fed through second single-headed bonding machine 90, where bond pads 16 in a second direction will be bonded.

Figure 7:
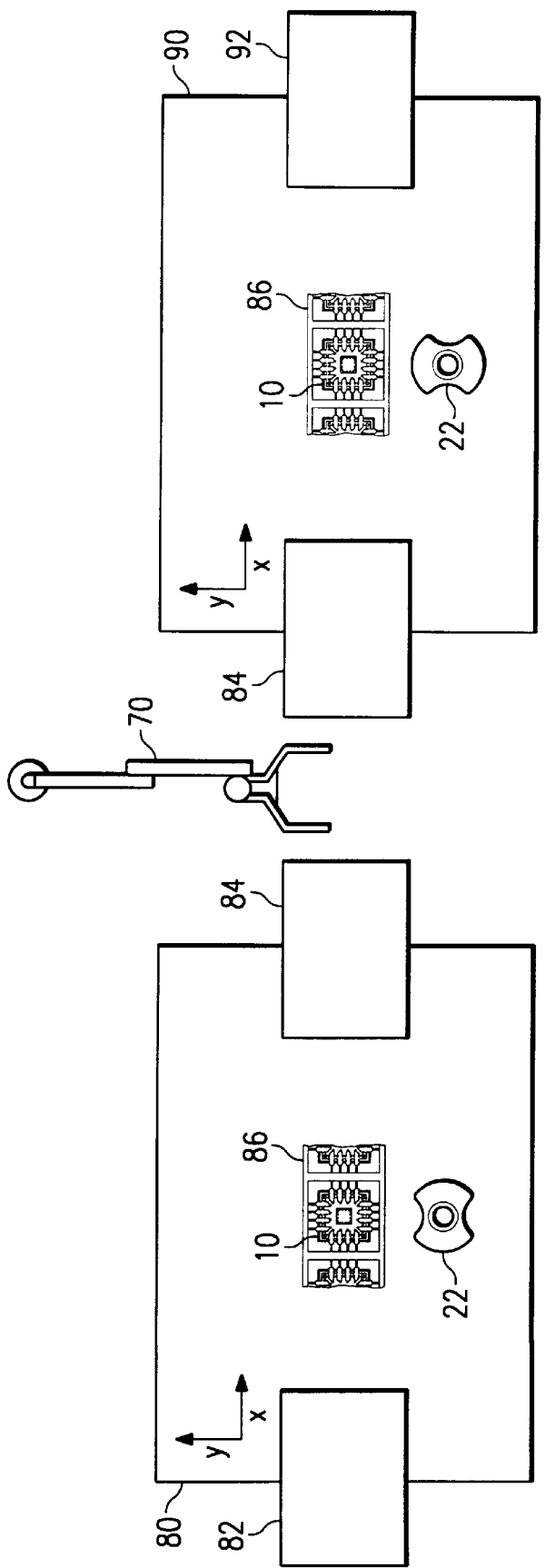
FIG. 7 illustrates a bonding technique using with two single-headed bonding machines and a robotic arm.

FIG. 7 illustrates a bonding technique using two single-headed bonding machines 80 and 90 and a robotic arm 70. The first single-headed bonding machine 80 has a single capillary 22 in a first orientation. The second single headed bonding machine 90 has a single capillary 22 in a second orientation which is preferably normal to the first orientation. In operation, lead frame strips 86, containing one or more lead frame/chip assemblies 10 will feed out of input carrier 82. Capillary 22 will bond bond pads 16 in one direction. As lead frame strips 86 are completed they fill output carrier 84. When all lead frame strips 86 are completed, output carrier 84 is removed from first single-headed bonding machine 80 by a robotic arm 70 and placed as the input carrier for second single-headed bonding machine 90. Although robotic arm 70 is illustrated, other automated transfer methods would work in a similar fashion, such as an automatic cart between the two machines. Lead frame strips 86 will feed from output carrier 84 (now the input for single-headed bonding machine 90). Bond pads 16 in a second direction are bonded and the output carrier for the second single-headed bonding machine 92 will fill up. Alternatively, instead of moving an entire carrier of lead frame strips 86, individual lead frame strips 86 can be moved from one bonder to another by robotic arm 70.

Thus, it is apparent that there has been provided, in accordance with the present invention, a method of using a single-headed bonder to form bonds that satisfies the advantages set forth above. Although the present invention has been described in detail, it should be understood that various changes, substitutions, and alterations can be made herein without departing from the spirit and scope of the present invention, as defined by the following claims.

What is claimed is:

1. A single-headed bonder for bonding bond pads of a lead frame/chip assembly, comprising:

a capillary having a capillary face with a long and a short dimension, the short dimension being shorter and in a direction normal to the long dimension, the capillary operable to place the long dimension in a first orientation to bond the bond pads in a first direction associated with the first orientation, the capillary operable to rotate and place the long dimension in a second direction associated with the second orientation.

2. The single-headed bonder of claim 1, wherein the first orientation is perpendicular to the second orientation.

3. The single-headed bonder of claim 1, wherein the capillary face has a non-circular shape.

4. The single-headed bonder of claim 3, wherein the capillary face has the general shape of a bow tie.

5. An apparatus for bonding pads of a lead frame/chip assembly, comprising:

a first single-headed bonding machine having a first capillary, the first capillary having a first capillary face with a long dimension and a short dimension, the short dimension being shorter and in a direction perpendicular to the long dimension, the long dimension being in a first orientation to bond pads in a first direction associated with the first orientation;

a second single-headed bonding machine having a second capillary, the second capillary having a second capillary face with a long dimension and a short dimension, the short dimension being shorter and in a direction perpendicular to the long dimension, the long dimension being in a second orientation to bond pads in a second direction associated with the second orientation.

6. The apparatus of claim 5, further comprising:

a transport mechanism operable to transfer the lead frame/chip assembly between the first single-headed bonding machine and the second single-headed bonding machine.

7. The apparatus of claim 5, further comprising:

a robotic arm operable to transfer the lead frame/chip assembly between the first single-headed bonding machine and the second single-headed bonding machine.

8. The apparatus of claim 5, wherein the first orientation is perpendicular to the second orientation.

9. The apparatus of claim 5, wherein the first and second capillary faces have a non-circular shape.

10. The apparatus of claim 9, wherein the first and second capillary faces have a general shape of a bow tie.

11. A method of making an integrated circuit device using a single-headed bonder, comprising the steps of:

providing a capillary having a capillary face with a long dimension and a short dimension, the short dimension being shorter than and in a direction transverse to the long dimension, the capillary oriented with the long dimension in a first orientation;

bonding a wire through the capillary between a first bond pad and a first lead of a lead frame/chip assembly, the wire bond between the first bond pad and the first lead being aligned in a first direction associated with the first orientation;

providing a rotated capillary oriented with the long dimension in a second orientation; and bonding a wire through the rotated capillary between a second bond pad and a second lead of a lead frame/chip assembly, the wire bond between the second bond pad and the second lead aligned in a second direction associated with the second orientation.

12. The method of claim 11, wherein the second orientation is normal to the first orientation.

13. The method of claim 11, wherein the step of providing a rotated capillary includes rotating the capillary such that the long dimension is in the second orientation.

14. The method of claim 11, wherein the capillary face has a non-circular shape.

15. The method of claim 14, wherein the long dimension and the short dimension provide the capillary face with a general shape of a bow tie.

16. The method of claim 11, wherein the step of providing a rotated capillary includes transporting the lead frame/chip assembly to a second single-headed bonder containing the rotated capillary.

17. The method of claim 16, wherein the transporting step comprises transporting the lead frame/chip assembly with a robotic arm.

18. The method of claim 16, wherein the transporting step comprises transporting the lead frame/chip assembly with a transport mechanism.

\* \* \* \* \*